(12) United States Patent
Dunn et al.

(10) Patent No.: US 8,933,375 B2
(45) Date of Patent: Jan. 13, 2015

(54) SUSCEPTOR HEATER AND METHOD OF HEATING A SUBSTRATE

(75) Inventors: Todd Dunn, Cave Creek, AZ (US); Fred Alokozai, Scottsdale, AZ (US); Jerry Winkler, Gilbert, AZ (US); Michael Halpin, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 83 days.

(21) Appl. No.: 13/535,214

(22) Filed: Jun. 27, 2012

(65) Prior Publication Data

US 2014/0000843 A1 Jan. 2, 2014

(51) Int. Cl.
*F27B 5/14* (2006.01)
*F26B 19/00* (2006.01)

(52) U.S. Cl.
USPC ............ 219/390; 219/385; 392/416; 118/724

(58) Field of Classification Search
USPC ................. 219/390, 405, 411; 392/416, 418; 118/724, 725, 50.1, 728–730
See application file for complete search history.

(56) References Cited

U.S. PATENT DOCUMENTS

| | | |
|---|---|---|
| 2,745,640 A | 5/1956 | Cushman |
| 2,990,045 A | 9/1959 | Root |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,058,430 A | 11/1977 | Suntola et al. |
| 4,176,630 A | 12/1979 | Elmer |
| 4,194,536 A | 3/1980 | Stine et al. |
| 4,389,973 A | 6/1983 | Suntola et al. |
| 4,393,013 A | 7/1983 | McMenamin |
| 4,436,674 A | 3/1984 | McMenamin |
| 4,570,328 A | 2/1986 | Price et al. |
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,789,294 A | 12/1988 | Sato et al. |
| 4,821,674 A | 4/1989 | deBoer et al. |
| 4,991,614 A | 2/1991 | Hammel |
| 5,062,386 A | 11/1991 | Christensen |
| 5,167,716 A | 12/1992 | Boitnott et al. |
| 5,199,603 A | 4/1993 | Prescott |
| 5,221,556 A | 6/1993 | Hawkins et al. |

(Continued)

FOREIGN PATENT DOCUMENTS

| | | |
|---|---|---|
| CN | 1563483 A | 12/2006 |
| CN | 101330015 | 12/2008 |

(Continued)

OTHER PUBLICATIONS

USPTO; Office Action dated Aug. 27, 2010 in U.S. Appl. No. 12/118,596.

(Continued)

*Primary Examiner* — Shawntina Fuqua
(74) *Attorney, Agent, or Firm* — Snell & Wilmer LLP

(57) ABSTRACT

A wafer processing apparatus may include a susceptor having a top side and a backside, a susceptor heater having a spacing member and a heating member, a shim removably mounted between the susceptor and the susceptor heater, a cavity formed by the susceptor backside, the susceptor heater, and the shim, a fluid inlet communicating with the cavity, and a plurality of fluid outlets communicating with the cavity.

26 Claims, 8 Drawing Sheets

(56) References Cited

U.S. PATENT DOCUMENTS

| | | |
|---|---|---|
| 5,243,195 A | 9/1993 | Nishi |
| 5,380,367 A | 1/1995 | Bertone |
| 5,595,606 A | 1/1997 | Fujikawa et al. |
| 5,632,919 A | 5/1997 | MacCracken et al. |
| 5,730,801 A | 3/1998 | Tepman |
| 5,732,744 A | 3/1998 | Barr et al. |
| 5,736,314 A | 4/1998 | Hayes et al. |
| 5,796,074 A * | 8/1998 | Edelstein et al. ............ 219/390 |
| 5,836,483 A | 11/1998 | Disel |
| 5,855,680 A | 1/1999 | Soininen et al. |
| 5,979,506 A | 11/1999 | Aarseth |
| 6,013,553 A | 1/2000 | Wallace |
| 6,015,465 A | 1/2000 | Kholodenko et al. |
| 6,060,691 A | 5/2000 | Minami et al. |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,148,761 A | 11/2000 | Majewski et al. |
| 6,161,500 A | 12/2000 | Kopacz et al. |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,569,239 B2 | 5/2003 | Arai et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,648,974 B1 | 11/2003 | Ogliari et al. |
| 6,682,973 B1 | 1/2004 | Paton et al. |
| 6,710,364 B2 | 3/2004 | Guldi et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,847,014 B1 | 1/2005 | Benjamin et al. |
| 6,858,547 B2 | 2/2005 | Metzner |
| 6,875,677 B1 | 4/2005 | Conley, Jr. et al. |
| 6,884,066 B2 | 4/2005 | Nguyen et al. |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,437,060 B2 | 10/2008 | Wang et al. |
| 7,442,275 B2 | 10/2008 | Cowans |
| 7,489,389 B2 | 2/2009 | Shibazaki |
| 7,547,363 B2 | 6/2009 | Tomiyasu et al. |
| 7,601,223 B2 | 10/2009 | Lindfors et al. |
| 7,601,225 B2 | 10/2009 | Tuominen et al. |
| 7,640,142 B2 | 12/2009 | Tachikawa et al. |
| D614,153 S | 4/2010 | Fondurulia et al. |
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,851,019 B2 | 12/2010 | Tuominen et al. |
| 7,884,918 B2 | 2/2011 | Hattori |
| 8,041,197 B2 | 10/2011 | Kasai et al. |
| 8,071,451 B2 | 12/2011 | Berry |
| 8,071,452 B2 | 12/2011 | Raisanen |
| 8,072,578 B2 | 12/2011 | Yasuda |
| 8,076,230 B2 | 12/2011 | Wei |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,147,242 B2 | 4/2012 | Shibagaki et al. |
| 8,278,176 B2 | 10/2012 | Bauer et al. |
| 8,282,769 B2 | 10/2012 | Iizuka |
| 8,293,016 B2 | 10/2012 | Bahng et al. |
| 8,309,173 B2 | 11/2012 | Tuominen et al. |
| 8,367,528 B2 | 2/2013 | Bauer et al. |
| 8,608,885 B2 | 12/2013 | Goto et al. |
| 8,683,943 B2 | 4/2014 | Onodera et al. |
| 8,711,338 B2 | 4/2014 | Liu et al. |
| 8,726,837 B2 | 5/2014 | Patalay et al. |
| 2002/0001974 A1 | 1/2002 | Chan |
| 2002/0064592 A1 | 5/2002 | Datta et al. |
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0111963 A1 | 6/2003 | Tolmachev et al. |
| 2003/0141820 A1 | 7/2003 | White et al. |
| 2003/0228772 A1 | 12/2003 | Cowans |
| 2003/0232138 A1 | 12/2003 | Tuominen et al. |
| 2004/0013577 A1 | 1/2004 | Ganguli et al. |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0219793 A1 | 11/2004 | Hishiya et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0110069 A1 | 5/2005 | Kil et al. |
| 2005/0173003 A1 | 8/2005 | Laverdiere et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229972 A1 | 10/2005 | Hoshi et al. |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2006/0013946 A1 | 1/2006 | Park et al. |
| 2006/0019033 A1 | 1/2006 | Muthukrishnan et al. |

(56) References Cited

U.S. PATENT DOCUMENTS

| | | |
|---|---|---|
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0022954 A1 | 2/2007 | Iizuka et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0066010 A1 | 3/2007 | Ando |
| 2007/0077355 A1 | 4/2007 | Chacin et al. |
| 2007/0084405 A1 | 4/2007 | Kim |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0261413 A1 | 10/2008 | Mahajani |
| 2008/0282970 A1 | 11/2008 | Heys et al. |
| 2009/0011608 A1 | 1/2009 | Nabatame |
| 2009/0020072 A1 | 1/2009 | Mizunaga et al. |
| 2009/0061644 A1 | 3/2009 | Chiang et al. |
| 2009/0085156 A1 | 4/2009 | Dewey et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0124610 A1 | 5/2010 | Aikawa et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0256734 A1 | 10/2011 | Hausmann et al. |
| 2011/0275166 A1 | 11/2011 | Shero et al. |
| 2012/0090704 A1 | 4/2012 | Laverdiere et al. |
| 2012/0098107 A1 | 4/2012 | Raisanen et al. |
| 2012/0160172 A1 | 6/2012 | Wamura et al. |
| 2012/0240858 A1 | 9/2012 | Taniyama et al. |
| 2012/0295427 A1 | 11/2012 | Bauer |
| 2012/0304935 A1 | 12/2012 | Oosterlaken et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2014/0000843 A1 | 1/2014 | Dunn et al. |
| 2014/0014644 A1 | 1/2014 | Akiba et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0084341 A1 | 3/2014 | Weeks |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |

FOREIGN PATENT DOCUMENTS

| | | |
|---|---|---|
| CN | 101423937 A | 9/2011 |
| JP | 07283149 | 10/1995 |
| JP | 08335558 | 12/1996 |
| JP | 2001342570 | 12/2001 |
| JP | 2004014952 A | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | 200701301 A | 1/2007 |
| WO | 2006/056091 A1 | 6/2006 |
| WO | 2006/078666 | 7/2006 |

OTHER PUBLICATIONS

USPTO; Office Action dated Feb. 15, 2011 in U.S. Appl. No. 12/118,596.

USPTO; Notice of Allowance dated Aug. 4, 2011 in U.S. Appl. No. 12/118,596.

USPTO; Notice of Allowance dated Jun. 16, 2011 in U.S. Appl. No. 12/430,751.

USPTO; Notice of Allowance dated Jul. 27, 2011 in U.S. Appl. No. 12/430,751.

PCT; International Search report and Written Opinion dated Nov. 12, 2010 in Application No. PCT/US2010/030126.

PCT; International Search report and Written Opinion dated Jan. 12, 2011 in Application No. PCT/US2010/045368.

Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.

Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.

(56) References Cited

OTHER PUBLICATIONS

USPTO; Office Action dated Apr. 23, 2013 in U.S. Appl. No. 12/763,037.
USPTO; Office Action dated Jan. 15, 2013 in U.S. Appl. No. 12/754,223.
USPTO; Office Action dated Feb. 26, 2013 in U.S. Appl. No. 12/754,223.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 is Serial No. 201080015699.9.
Novaro et al. Theoretical Study on a Reaction Pathway of Ziegler-Natta-Type Catalysis, J. Chem. Phys. 68(5), Mar. 1, 1978 p. 2337-2351.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Dec. 25, 2014 in Serial No. 2012-504786.
USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.

* cited by examiner

SUSCEPTOR HEATER AND METHOD OF HEATING A SUBSTRATE

FIELD OF THE DISCLOSURE

This disclosure relates generally to semiconductor processing, and more particularly to a susceptor and susceptor heater providing a more uniform heat distribution to a substrate.

BACKGROUND

Semiconductor fabrication processes are typically conducted with the substrates supported within a chamber under controlled conditions. For many purposes, semiconductor substrates (e.g., wafers) are heated inside the process chamber. For example, substrates can be heated by direct physical contact with an internally heated wafer holder or "chuck." "Susceptors" are wafer supports used in systems where the wafer and susceptors absorb heat.

Some of the important controlled conditions for processing include, but are not limited to, fluid flow rate into the chamber, temperature of the reaction chamber, temperature of the fluid flowing into the reaction chamber, and temperature of the fluid throughout the fluid line.

Heating within the reaction chamber can occur in a number of ways, including lamp banks or arrays positioned above the substrate surface for directly heating the susceptor or susceptor heaters/pedestal heaters position below the susceptor. Traditionally, the pedestal style heater extends into the chamber through a bottom wall and the susceptor is mounted on a top surface of the heater. The heater may include a resistive heating element enclosed within the heater to provide conductive heat and increase the susceptor temperature. A major drawback to the resistive pedestal heater is the great deal of heat necessary in order to sufficiently raise the top surface temperature of the susceptor. In order to provide this high level of heat transfer, the pedestal heater and the susceptor interface becomes very hot and may lead to fusion between the two parts. Unfortunately, fusing the susceptor and heater together leads to increased reaction chamber downtime and additional refurbishment/replacement costs. Still further, there remains a continued risk of uneven heating susceptor heating.

SUMMARY

Various aspects and implementations are disclosed herein that relate to substrate support assembly designs and methods of heating a substrate within a reaction chamber. In one aspect, a susceptor heater includes a spacing member, a heating member connected to the spacing member, a shim removably mounted on the heating member, a fluid line inlet traversing the heating member, and a heat conductive fluid introduced through the fluid line inlet.

In an implementation, the susceptor heater may further include a fluid manifold connected to the heating member and the fluid line inlet. The susceptor heater fluid manifold may further include an inlet port and at least one outlet port. The at least one manifold outlet port may be positioned at an angle between 90 degrees and 180 degrees from the inlet port. The at least one outlet port may be three outlet ports positioned 120 degrees apart from each other. The fluid manifold may position a susceptor on the susceptor heater.

The susceptor heater may further include a susceptor positioned on the shim and defining a cavity between the susceptor, the shim, and the heating member. The cavity may further include a variable cross-sectional area. The heat conductive fluid may be selected from the group consisting of helium, nitrogen, and hydrogen. The susceptor heater may further include at least one fluid line exit positioned radially outside of the fluid line inlet. Each of the at least one fluid line exits may surround a wafer lift pin.

Each of the at least one fluid line exits may be in communication with a slot in the heating member. The slot may be in fluid communication with an outlet port. The heat conductive fluid may flow radially outward from the fluid line inlet. The susceptor heater may further include a heating element disposed within the heating member radially inward from the shim. The heating element may be positioned below a cavity formed by a susceptor, the shim, and the heating member.

In another aspect, a wafer processing apparatus may include a susceptor having a top side and a backside, a susceptor heater having a spacing member and a heating member, a shim removably mounted between the susceptor and the susceptor heater, a cavity formed by the susceptor backside, the susceptor heater, and the shim, a fluid inlet communicating with the cavity, and a plurality of fluid outlets communicating with the cavity.

In an implementation, the wafer processing apparatus may further include flowing a heat conducting fluid through the fluid inlet, the cavity, and the plurality of fluid outlets. The heat conducting fluid may be helium. A heating element may be disposed within the susceptor heater and provides thermal energy to the heat conducting fluid. The fluid may flow radially outward from the fluid line inlet to the plurality of fluid outlets through the cavity.

In yet another aspect, a method of heating a susceptor in a wafer processing chamber includes the method of providing a susceptor having a top side and a backside, a susceptor heater having a spacing member and a heating member, a shim removably mounted between the susceptor and the susceptor heater, a cavity formed by the susceptor backside, the susceptor heater, and the shim, a fluid inlet communicating with the cavity, and a plurality of fluid outlets communicating with the cavity, powering the heating element, and flowing a heat conductive fluid through the fluid inlet, the cavity, and the plurality of fluid outlets.

In an implementation, the heat conductive fluid may be helium. The fluid inlet orients the fluid flow within the cavity. A portion of the plurality of fluid outlets may be adjacent the shim and a portion of the plurality of fluid outlets may surround a plurality of lift pins. The heat conductive fluid may be cooled prior to the flowing step to reduce the susceptor temperature.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The present aspects and implementations may be described in terms of functional block components and various processing steps. Such functional blocks may be realized by any number of hardware or software components configured to perform the specified functions and achieve the various results. For example, the present aspects may employ various sensors, detectors, flow control devices, heaters, and the like, which may carry out a variety of functions. In addition, the present aspects and implementations may be practiced in conjunction with any number of processing methods, and the apparatus and systems described may employ any number of processing methods, and the apparatus and systems described are merely examples of applications of the invention.

Figure 1:
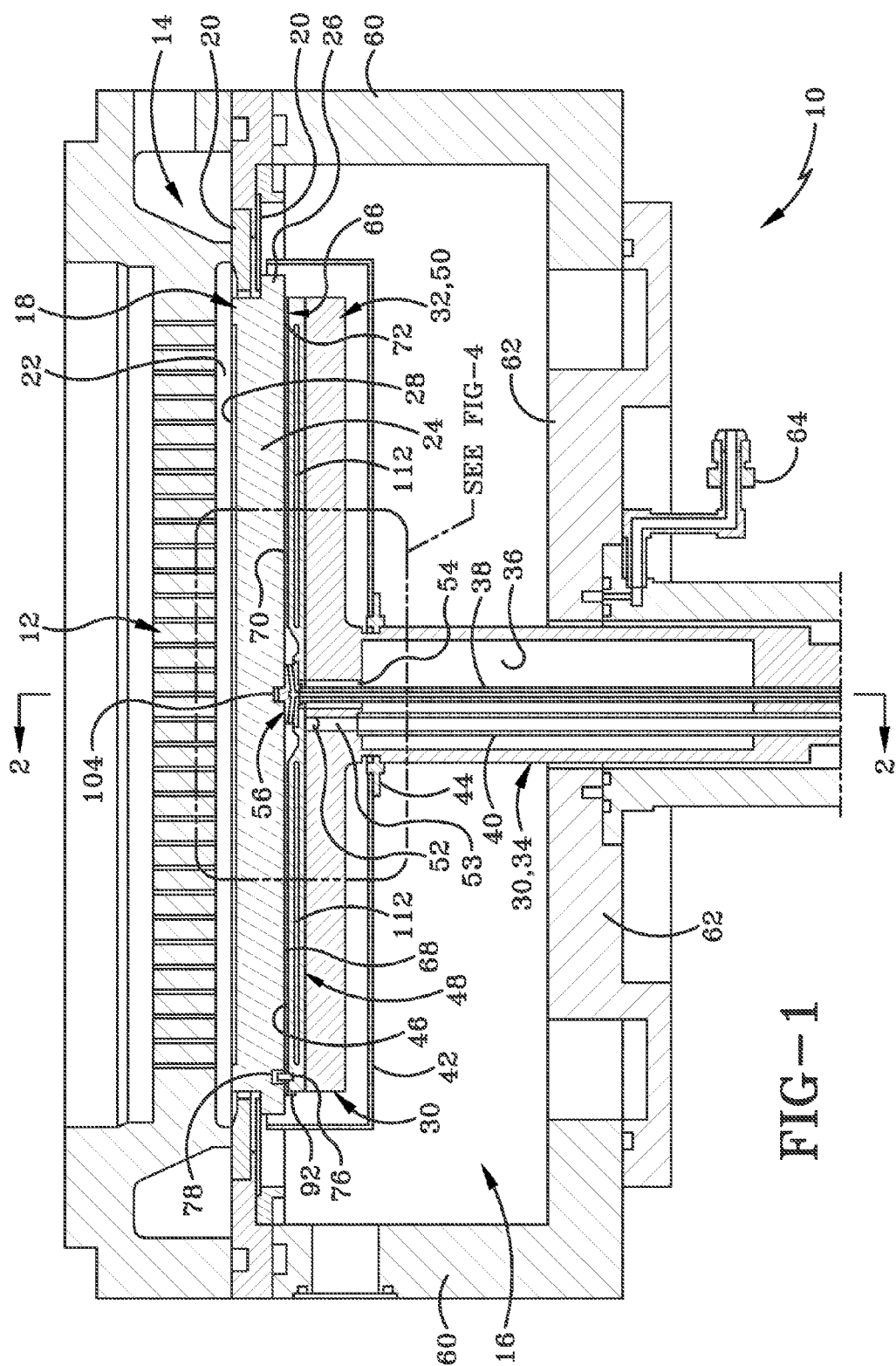
FIG. 1 is a cross-sectional view of a reaction chamber with a susceptor, a susceptor heater, and a cavity between the susceptor and the susceptor heater.
Figure 2:
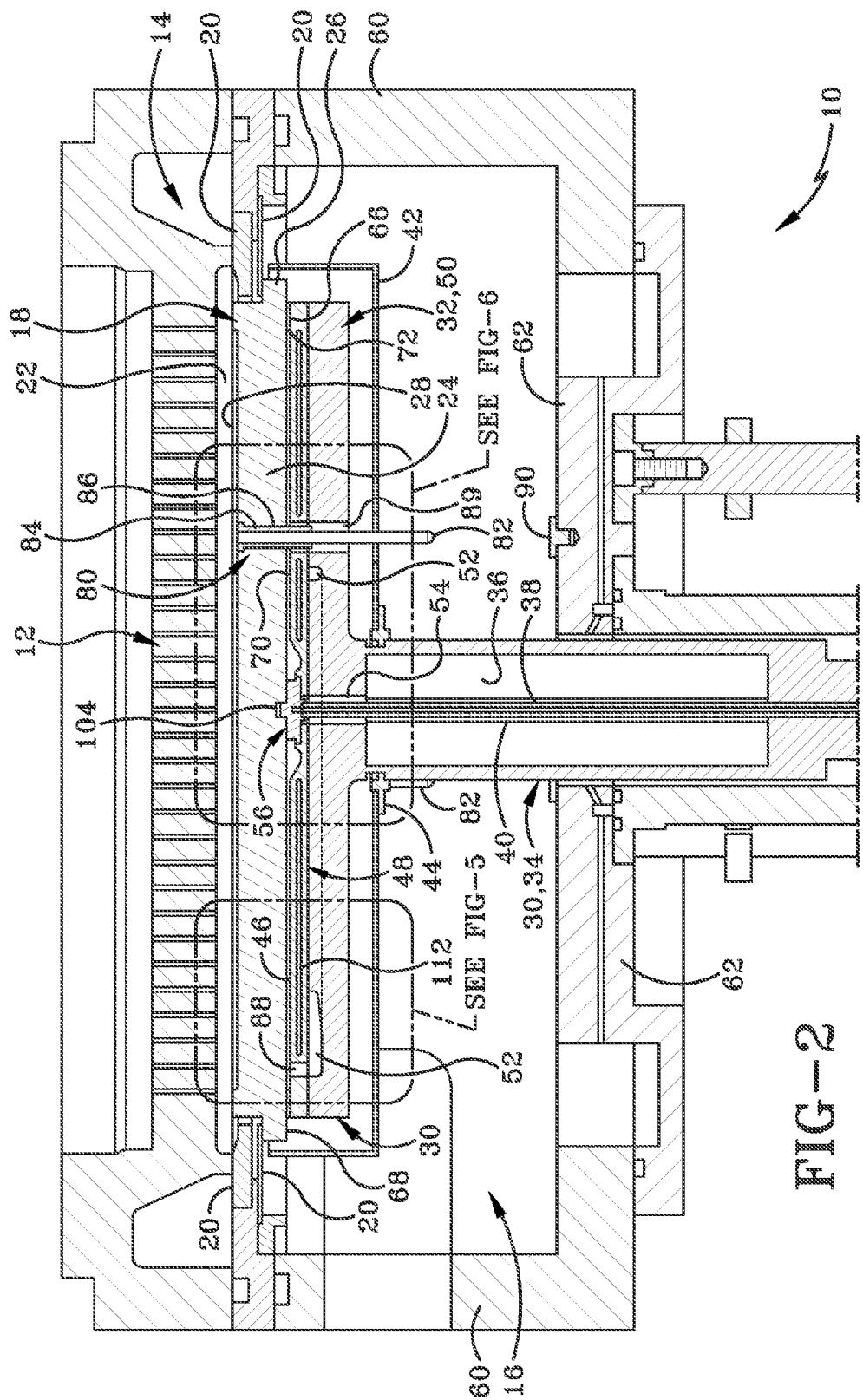
FIG. 2 is a cross-sectional view of a reaction chamber with a susceptor, a susceptor heater, and a cavity between the susceptor and the susceptor heater.

FIGS. 1 and 2 illustrate two cross-sectional views of a reaction chamber 10 taken along two different section lines to illustrate some of the various components therein. Reaction chamber 10 includes a showerhead 12 for directing process gases into the reaction chamber 10 and particularly on a substrate to be processed. The reaction chamber 10 may be divided into two chambers, an upper chamber 14 and a lower chamber 16 in one aspect. Upper chamber 14 generally includes showerhead 12, susceptor 18, and a chamber sealing mechanism 20 which together define a processing area 22. Processing area 22 is further generally defined by a bottom surface of showerhead 12 and a top surface of susceptor 18. Susceptor 18 may also include a central portion 24, a sealing ring 26, and a wafer positioning ring 28. Sealing ring 26 may be used to contact chamber sealing mechanism 20 when the susceptor 18 is in the processing position to separate the upper chamber 14 and lower chamber 16. Although the chamber sealing mechanism 20 is shown as a solid member, it may be semi-rigid, flexible, a labyrinth type seal in conjunction with the susceptor sealing ring 26, or any other suitable sealing mechanism to separate the upper chamber 14 from the lower chamber 16.

Moving to the lower chamber 16, a susceptor heater 30 includes a heating member 32 having a shape similar to susceptor 18 and a spacing member 34 positioned generally 90 degrees from heating member 32. Spacing member 34 may include a spacing bore 36 extending through a portion of spacing member 34 to carry an inlet tube 38 and an outlet tube 40 therein. A radiation shield 42 is secured to spacing member 34 with a radiation shield mount 44 on the exterior of spacing member 34. Radiation shield 42 limits the radiant heat lost to the lower chamber during processing.

Heating member 32 may include any number of heating mechanisms (not specifically shown) known in the art, including but not limited to a resistance heater, lamp banks, or inductive heaters. The heating mechanism is generally positioned near a top surface 46 of heating member 32 and within a heater section 48. In most aspects, the heating mechanism is positioned wholly within the heater section 48 and is not separately visible, but may be in certain instances. Further, a lower portion 50 of heating member 32 and heater section 48 may be fused together or assembled as a single piece.

Heating member 32 may also include a slot 52 communicating with outlet tube 40 to direct a gas flow from the susceptor heater 30 as will be described in greater detail below. The heating member 32 may include a through hole 54 disposed within the member for receiving inlet tube 38 and a fluid manifold 56. A through hole 53 may be disposed proximate through hole 54 and is in fluid communication with slot 52 and outlet tube 40. Fluid manifold 56 may be mounted directly to inlet tube 38 and may assist in positioning the susceptor 18 with respect to susceptor heater 30.

As also shown in FIG. 1, lower chamber 16 may be partially defined by a chamber 58 formed by side walls 60 and bottom wall 62. An inert gas line 64 may be used to permit a continuous flow of a gas into the lower chamber 16 to assist in maintaining the chamber temperature. In one implementation, the inert gas line 64 provides an inert gas, although any suitable fluid may be utilized beyond an inert gas.

Moving to the interface between susceptor 18 and susceptor heater 30, a shim 66 may be positioned on heating member top surface 46 and contacting a bottom surface 68 of susceptor 18 when fully assembled. Shim 66 may have an open central portion defining a heating cavity 70 between an inner surface 72 of shim 66, the bottom surface 68 of susceptor 18 and the top surface 46 of susceptor heater 30. Further, shim 66 may have an aperture 74 (shown in FIG. 7 for example) for receiving a locating pin 76 embedded in susceptor heater 30 and receivable within a bore 78 in susceptor 18 and particularly bottom surface 68 of the susceptor.

FIG. 2 illustrates another cross-sectional view of the assembled reactor in the processing position. Slot 52 is shown on both a right side and a left side of inlet tube 38 to provide a return line to the outlet tube in order to remove the flow of a heat conductive fluid as will be discussed in greater detail below. A lift pin assembly 80 is shown to the right of inlet tube 38. However, in this implementation three lift pin assemblies are utilized. Nevertheless it is within the spirit and scope of the disclosure to incorporate any number of lift pin assemblies as may be required by the application.

Lift pin assembly 80 may include a lift pin 82 slidably maintained within a lift pin bushing 84. Lift pin bushing 84 is usually press fit into a through hole 86 in susceptor 18, while the lift pin may also pass through a fluid line exit 89. Fluid line exit 89 is preferably sized large enough to permit both lift pin 82 to pass through as necessary, but also to simultaneously flow heat conductive fluid therethrough. Similar to traditional operation, a lift pin stop 90 is position along bottom wall 62 and functions to bias lift pin 82 upwards when a bottom portion of lift pin 82 contacts lift pin stop 90, thereby raising the substrate on the susceptor.

Figure 3:
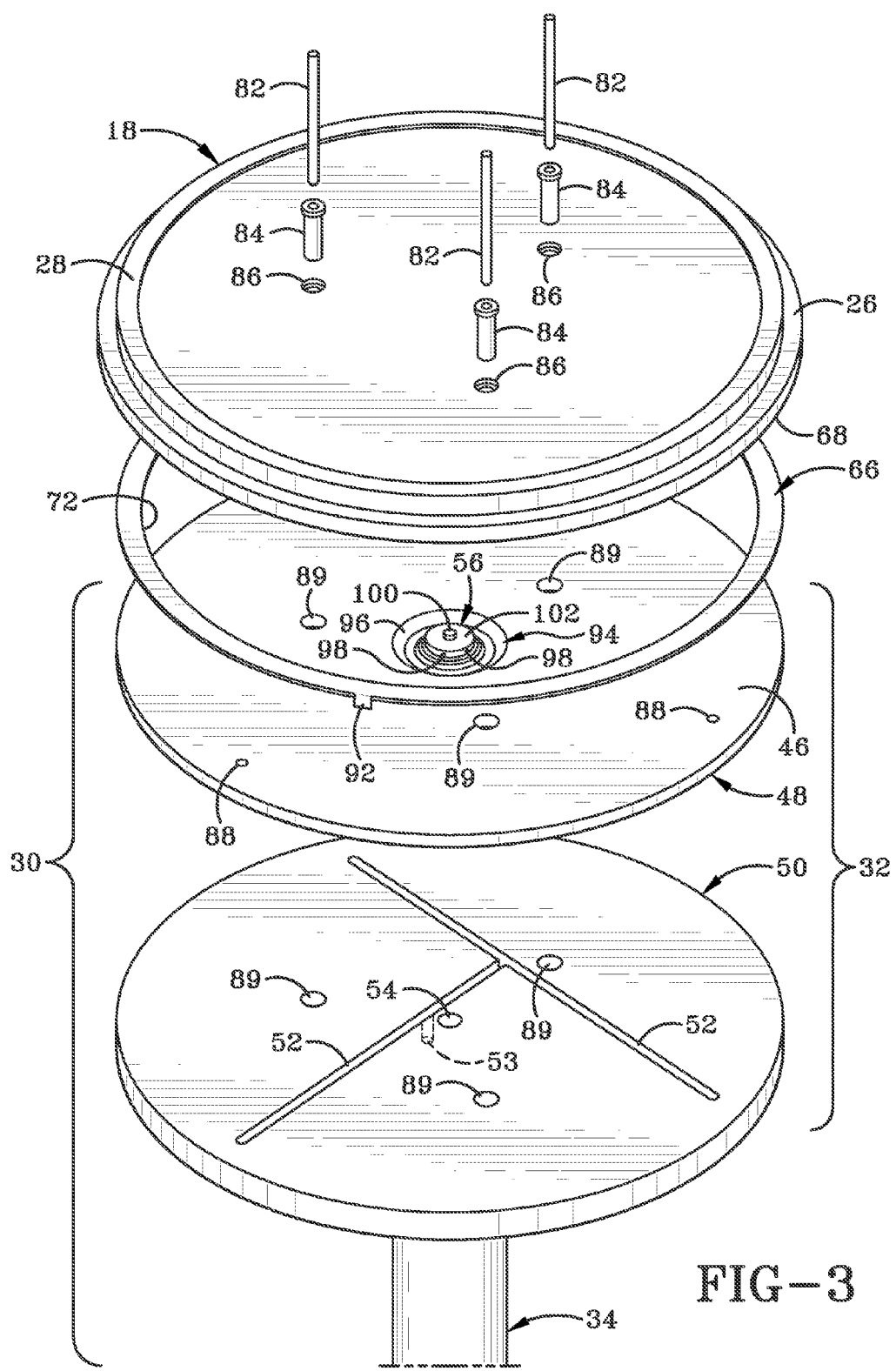
FIG. 3 is an exploded perspective view of a substrate support assembly with a shim and fluid flow cavities.

FIG. 3 illustrates a perspective exploded view of susceptor 18, shim 66, and susceptor heater 30. Shim 66 may include a plurality of locating tabs 92 extending downward from the perimeter of shim 66 arranged to contact an outer perimeter of susceptor heater 30 and assisting in maintaining the position of shim 66 during processing. Heater section 48 of susceptor heater 30 includes a plurality of fluid line exits 88 and 89, with one implementation having three fluid line exits 88 positioned adjacent an outer edge of heater section 48 and three fluid line exits 89 positioned coaxial with lift pins 82 and through holes 86. Still further, in this implementation, the fluid line exits 88 positioned adjacent an outer edge of heater section 48 are preferably aligned with slots 52 in lower portion 50 and more preferably aligned with an outer edge of slots 52. Slots 52 are used to direct the fluid flow radially back towards the center after providing heat transfer to susceptor 18 and ultimately the substrate to be processed.

Fluid manifold 56 is positioned within a recessed portion 94 having ramped side walls 96 which provide an angular flow to the conductive fluid exiting fluid manifold 56 through the manifold outlet ports 98 and into heating cavity 70. As discussed above, fluid manifold 56 also includes a centering protrusion 100 and a spacing portion 102. Centering protrusion 100 is oriented to fit within a susceptor centering aperture 104 and provide more accurate and efficient positioning of the susceptor. Further, spacing portion 102 provides a flat surface for susceptor bottom surface 68 to contact while still maintaining heating cavity 70 between the non-contacted portion of susceptor bottom surface 68 and heating member top surface 46 of susceptor heater 30. Accordingly, there is provided a fluid line inlet in fluid communication with a fluid manifold to direct a heat conductive fluid in a cavity between the susceptor and the susceptor heater. The heat conducting fluid then flows radially outward until reaching fluid line exits 88 adjacent the outer edge or fluid line exits 89 surrounding the lift pins, or both as necessary. The fluid then travels through the fluid line exits 88 and into slots 52 where the fluid is then directed radially inward towards outlet tube 40 to remove the fluid from the susceptor heater vicinity. Thus, it is seen that a fluid, or fluid in gaseous form, may be provided between the susceptor heater and the susceptor to provide a more efficient heat transfer from the susceptor heater to the susceptor and ultimately the substrate to be processed.

It should be noted that the advantageous heat transfer may occur primarily due to the presence of the heat conductive fluid 106 being present within the heating cavity 70 and that flowing of the fluid is not required. The heat conductive fluid assists by taking on energy from the susceptor heater and impacting the susceptor at a greater rate of speed to transfer the heat energy at a great velocity in one aspect.

Figure 4:
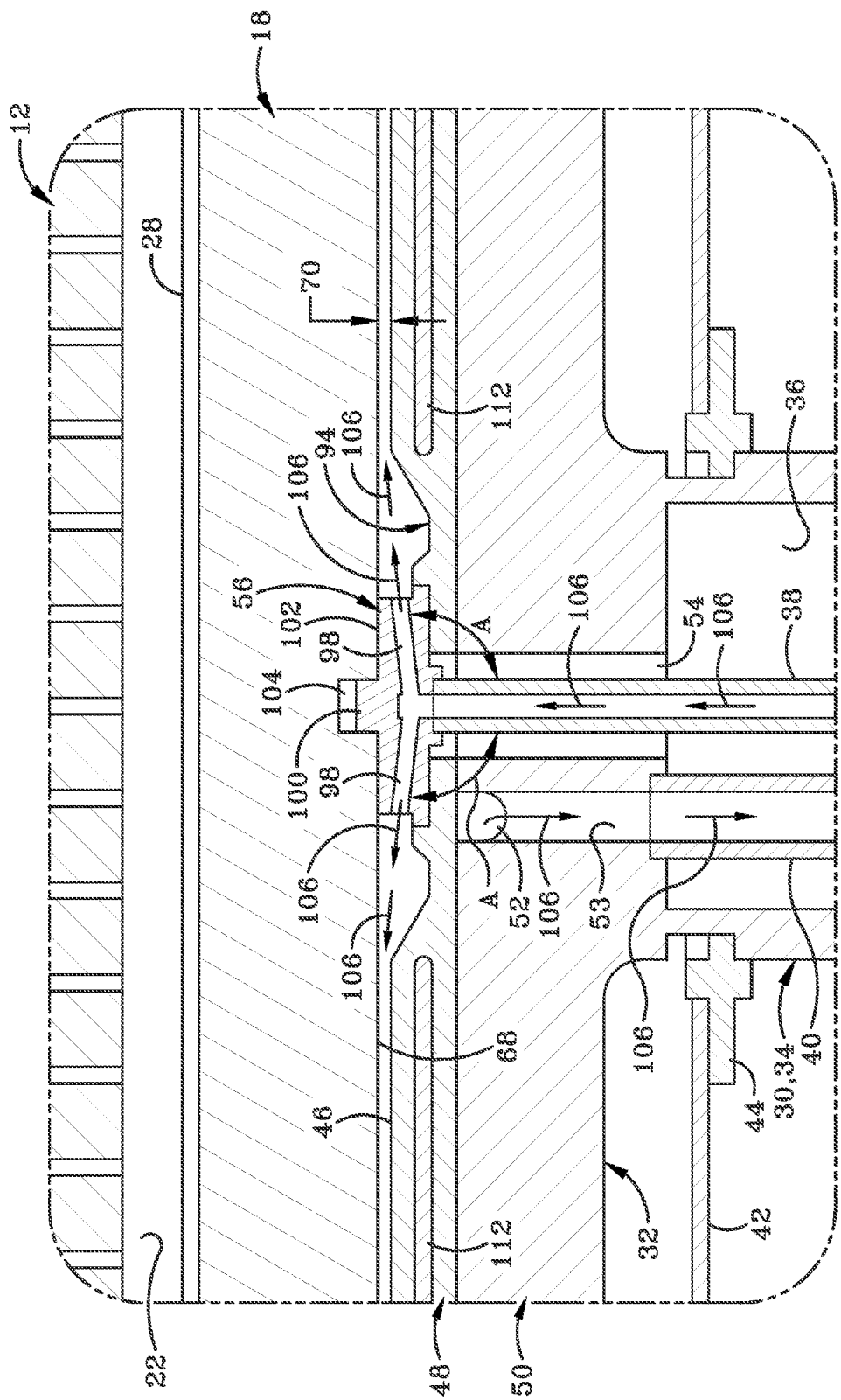
FIG. 4 is an enlarged cross-sectional view of the section labeled FIG. 4 in FIG. 1.

FIG. 4 illustrates an enlarged view of portions of susceptor 18 and susceptor heater 30. As particularly seen in this view, fluid manifold 56 is positioned between susceptor 18 and susceptor heater 30 and in fluid communication with inlet tube 38 and heating cavity 70. Specifically, manifold outlet ports 98 may be positioned at an angle A with respect to inlet tube 38. In one implementation, angle A can be between 90 degrees and 180 degrees, particularly between 90 degrees and 150 degrees, and more particularly at an angle A of 120 degrees from inlet tube 38. As such, the angle A provides for an angular exhaust of fluid manifold outlet ports 98 to direct a heat conductive fluid 106 into heating cavity 70.

A heat conductive fluid 106 is pumped through inlet tube 38 into fluid manifold 56 and then radially outward through heating cavity 70 and adjacent ramped sidewalls 96. The heat conductive fluid 106 exits manifold outlet ports 98 radially outward of inlet tube 38. While heating cavity 70 is shown as having a generally constant cross-sectional area radially outward of ramped sidewalls 96, the ramped sidewalls 96 assist is directing the heat conductive fluid 106 into the heating cavity 70 and may be used to increase the velocity of the fluid by modifying the shape of the ramps. Heating cavity 70 may have a variable cross-sectional thickness at various locations where an increase or a decrease in the amount of heat conductive fluid would affect the localized heat transfer to the specific position of the susceptor 18 and substrate being processed. Heat conductive fluid 106 may be any suitable liquid or gas, including but not limited to helium, nitrogen, or hydrogen. In another aspect, the heat conductive fluid 106 may be preheated before entering inlet tube 38 to reduce any heat loss between susceptor heater 30 and susceptor 18, or the heat conductive fluid 106 may enter the heating cavity 70 without any additional preheating as necessitated by the particular processing conditions. Further, the heat conductive fluid 106 can be used to achieve the opposite effect of cooling the susceptor 18 and susceptor heater 30 by cooling or chilling heat conductive fluid 106 and pumping the fluid through heating cavity 70 to remove the heat built up in the susceptor and susceptor heater to increase green to green time. Still further, the same concept can be used to rapidly increase the susceptor and susceptor heater temperatures by pumping preheated heat conductive fluid 106 within the heating cavity.

Figure 5:
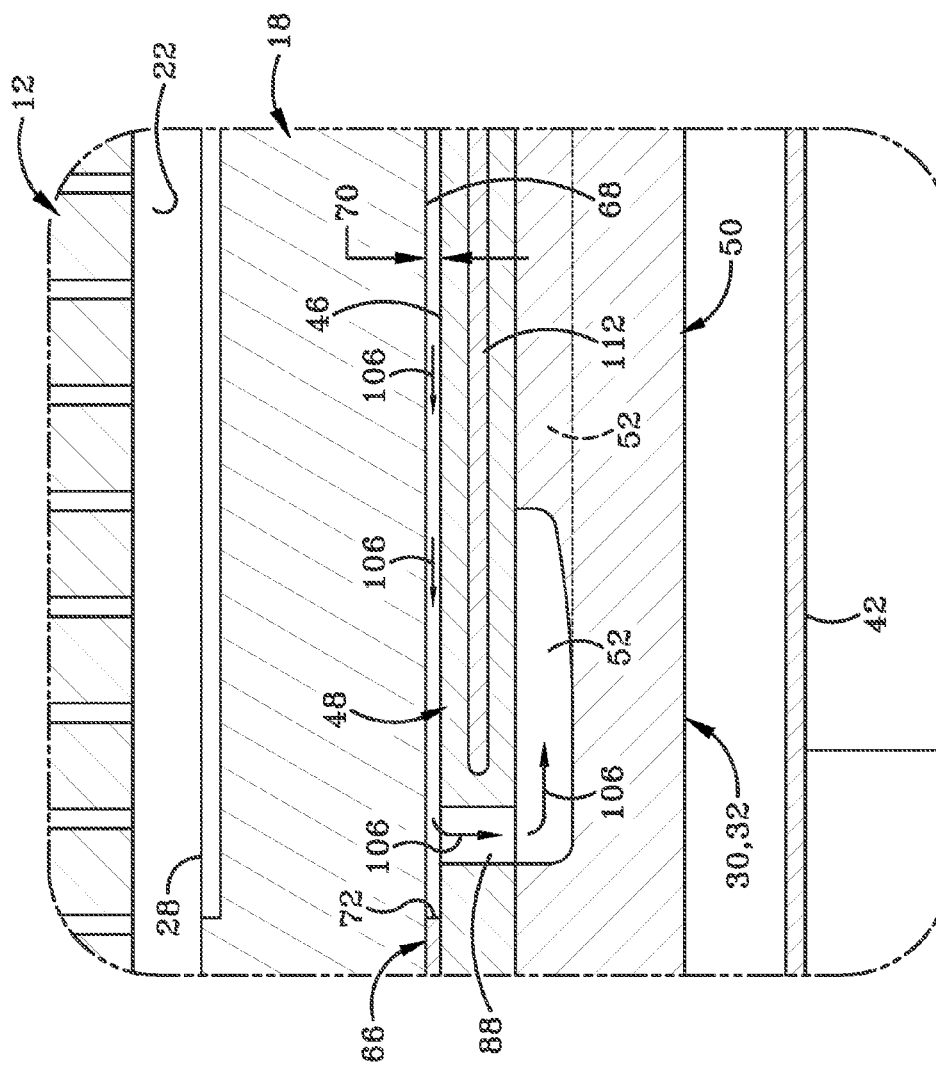
FIG. 5 is an enlarged cross-sectional view of the section labeled FIG. 5 in FIG. 2.

Referring now to FIG. 5, the heat conductive fluid 106 continues traveling radially outward until reaching fluid line exit 88 and traveling downward into slot 52. Once heat conductive fluid 106 enters slot 52, the heat conductive fluid is directed radially inward below the heater section 48 where a resistive heater 112 is positioned therein. Thus, the heat conductive fluid 106 is no longer providing the advantageous heat or energy transfer to susceptor 18 once the fluid is within slots 52 and traveling radially inward towards outlet tube 40. The heat conductive fluid 106 travels radially inward through slot 52 until reaching the through hole 53 in fluid communication with outlet tube 40 to direct the heat conductive fluid 106 out of the reaction chamber 10. Accordingly, this provides one potential full cycle of travel for the heat conductive fluid 106.

Figure 6:
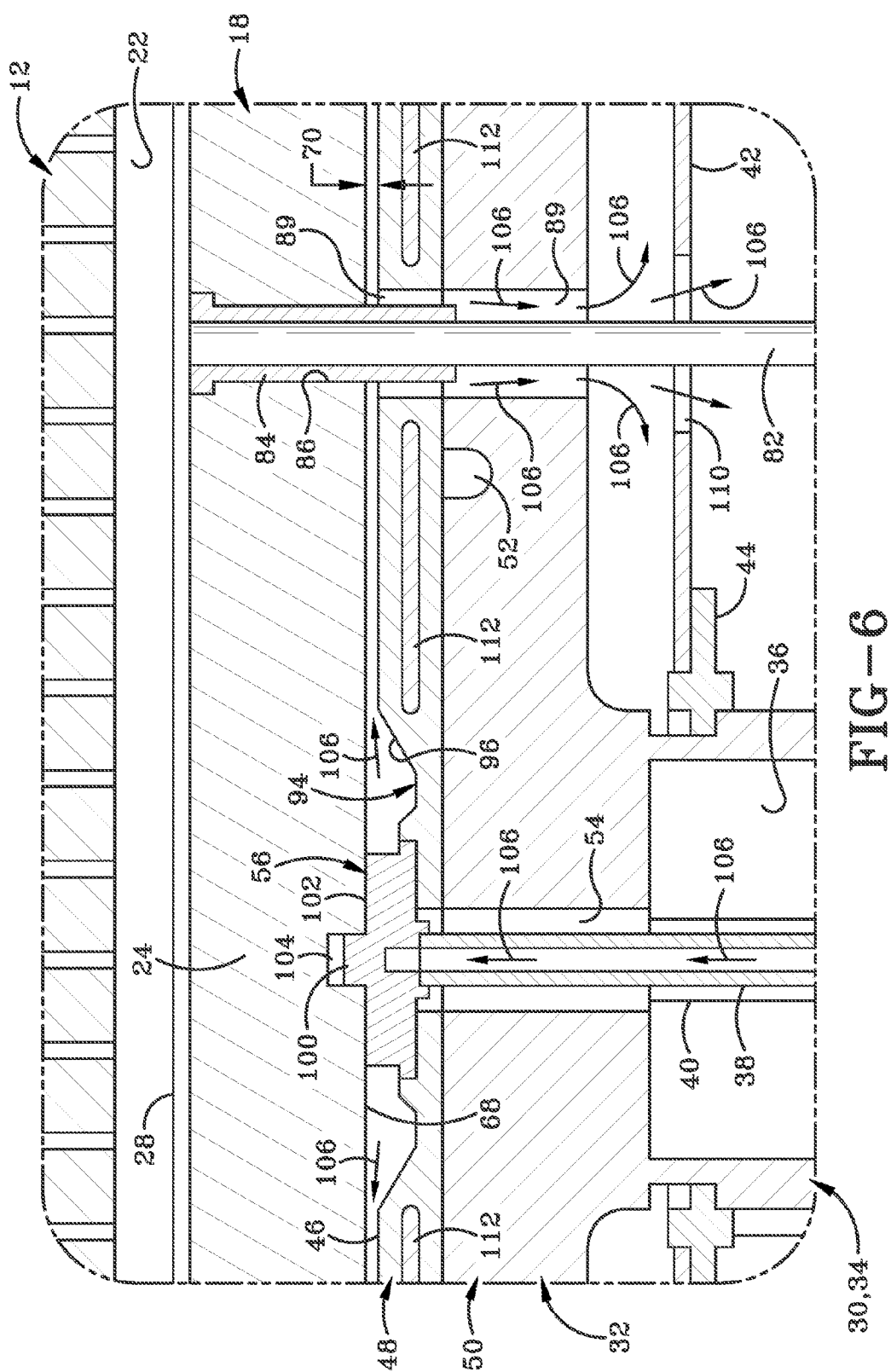
FIG. 6 is an enlarged cross-sectional view of the section labeled FIG. 6 in FIG. 2.

FIG. 6 illustrates another exit path for heat conductive fluid 106 in an implementation. Specifically, heat conductive fluid 106 is again pumped into heating cavity 70 where the fluid is directed radially outward until some or all of the heat conductive fluid 106 reaches fluid line exit 89 in susceptor heater 30 and travels around lift pin bushing 84 and lift pin 82. Further, the heat conductive fluid 106 may travel through an opening 110 in radiation shield 42 and enter lower chamber 16. Thus, it is seen that the heat conductive fluid 106 can provide an effective, efficient, and even means of transferring thermal energy from the susceptor heater to the susceptor by the presence of a heat conductive fluid 106 within the heating cavity 70. While the present disclosure shows and describes the heat conductive fluid as traveling radially outward when providing the heat transfer from the susceptor heater 30 to the susceptor 18, it is within the spirit and scope of the present disclosure to reverse the fluid flow travel direction to provide thermal energy transfer through the heat conductive fluid while the fluid travels radially inward.

Advantageously, the disclosure provides a number of other benefits, including but not limited to reducing a temperature lag during wafer pick-up since the heat transfer is more efficient, reduced power consumption and heater burnout due to lower power settings and cooler heating elements in the susceptor heater from the more efficient energy transfer to the susceptor, and increased cool down and warm up leading to shorter windows of tool downtime.

Figure 7:
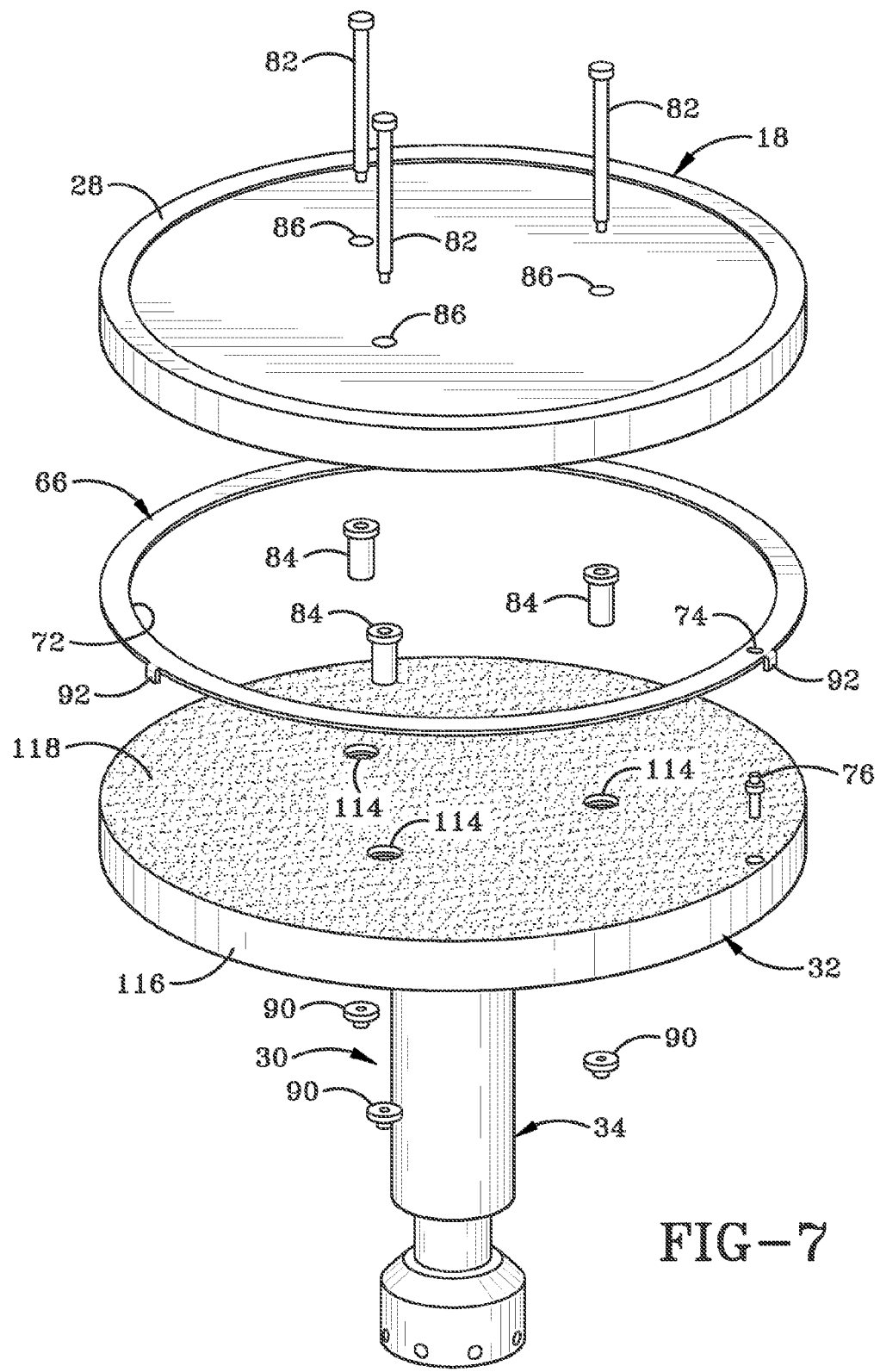
FIG. 7 is an exploded view of a second aspect susceptor and susceptor heater with a coated susceptor heater.
Figure 8:
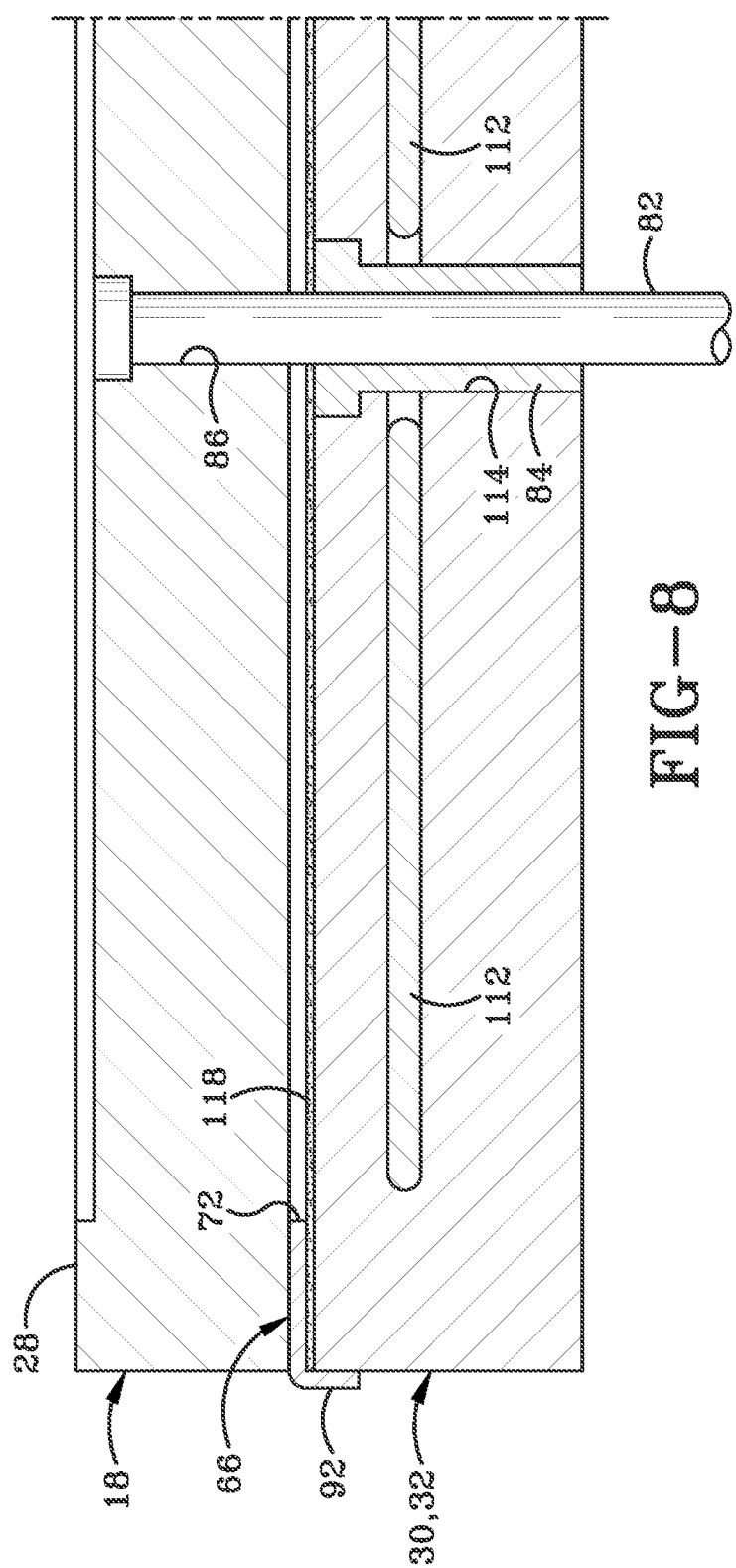
FIG. 8 is an enlarged cross-sectional view of the second aspect susceptor and susceptor heater.

FIGS. 7 and 8 illustrate a second aspect susceptor heater. Susceptor 18 is positioned and oriented similar to the first aspect susceptor and may include a plurality of lift pins 82, lift pin bushings 84, and through holes 86. Shim 66 with aperture 74 may be positioned between susceptor 18 and susceptor heater 30, with locating tabs 92 used to maintain the relative position of the shim 66 on the susceptor heater while locating pin 76 is used to prevent rotational movement of shim 66 during operation. Susceptor heater 30 may also include a spacing member 34 and a heating member 32 with a heating element 112 locating therein and through holes 114 aligned to receive lift pins 82. Heating element 112 may be a standard resistive heater element having one or more elements or coils to produce and direct the heat signature as necessary. Further, heating element 112 may be similar to the heating element 112 of the first aspect, which is used to heat the heat conductive fluid 106.

Heating member 32 of susceptor heater 30 may include a sidewall 116 formed of bare aluminum, oxidized aluminum, or machined stainless steel in non-limiting examples. These three non-limiting examples are each generally low emissivity materials encouraging a rather low level of heat loss through sidewall 116 of the susceptor heater. Bare aluminum has an emissivity of approximately 0.2, while anodized aluminum has an emissivity of approximately 0.5 to 0.7, and machined stainless steel has an emissivity of approximately 0.5.

Heating member 32 of susceptor heater 30 may also include a heat conductive surface 118 facing susceptor 18 to provide a more efficient heat transfer in the direction of the susceptor 18. Non-limiting examples of heat conductive surface 118 materials include aluminum nitride or aluminum oxide, which have respective emissivities of 0.9 and 0.765. Accordingly, it is seen that varying the heat conductive surface 118 to provide a higher emissivity material than the sidewall 116 provides for greater heat transfer directly to the susceptor 18 and reduces energy lost from heating element 112. Still further, by increasing the surface roughness of the heat conductive surface 118, even higher efficiency of heat transfer can be accomplished. Therefore it can be advantageous to polish sidewall 116 while increasing the surface roughness of heat conductive surface 118.

FIGS. 7 and 8 illustrate the incorporation of shim 66 with heat conductive surface 118 which extends to the edge of the susceptor heater 30 and adjacent sidewall 116. While this is one implementation of heat conductive surface 118, the heat conductive surface 118 may terminate at an inner surface 72 of shim 66 and be aligned with an outer perimeter of heating element 112. Further, shim 66 may be omitted and there can be direct contact between susceptor 18 and heat conductive surface 118. Still further, when omitting shim 66 the heat conductive surface 118 may extend to adjacent sidewall 116 or may terminate at a perimeter of heating element 112. Although not shown, heat conductive surface 118 may be positioned at only limited places on the face of susceptor heater 32 to provide localized heating on only certain portions of the susceptor 18.

A number of implementations have been separately disclosed. Nevertheless, a person of ordinary skill in the art will recognize that it is within the spirit and scope of the disclosure to combine multiple implementations. For example, heater section 48 and particularly heating member top surface 46 may be coated with aluminum nitride or aluminum trioxide to further increase the heat transfer efficiency of the heat conductive fluid 106 within heating cavity 70. While this is just one example, any number of suitable combinations may be created within the spirit and scope of the disclosure, including various aspects with or without shim 66.

These and other embodiments for methods and apparatus for a reaction chamber having a shim between the susceptor and heater to form a cavity for flowing a conductive fluid therein may incorporate concepts, embodiments, and configurations as described with respect to embodiments of apparatus for heaters described above. The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, any connecting lines shown in the various figures are intended to represent exemplary functional relationships and/or physical couplings between the various elements. Many alternative or additional functional relationship or physical connections may be present in the practical system, and/or may be absent in some embodiments.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

What is claimed is:

1. A susceptor heater assembly comprising:
a spacing member;
a heating member having a top surface connected to the spacing member;
a shim removably mounted on the heating member;
a susceptor having a bottom surface, the susceptor connected to the shim;
a fluid line inlet traversing the heating member;
a fluid line in fluid communication with a cavity between the bottom surface and the top surface;
a heat conductive fluid introduced through the fluid line inlet to provide heat transfer between the susceptor heater and the susceptor; and
an outlet tube to direct the heat conductive fluid from the cavity.

2. The susceptor heater of claim 1 further comprising a fluid manifold connected to the heating member and the fluid line inlet.

3. The susceptor heater of claim 2 wherein the fluid manifold further comprises an inlet port and at least one outlet port.

4. The susceptor heater of claim 3 wherein the at least one manifold outlet port is positioned at an angle between 90 degrees and 180 degrees from the inlet port.

5. The susceptor heater of claim 3 wherein the at least one outlet port is three outlet ports positioned 120 degrees apart from each other.

6. The susceptor heater of claim 2 wherein the fluid manifold positions a susceptor on the susceptor heater.

7. The susceptor heater of claim 1 further comprising a spacing portion.

8. The susceptor heater of claim 1 wherein the cavity further comprises a variable cross-sectional area.

9. The susceptor heater of claim 1 wherein the heat conductive fluid is selected from the group consisting of helium, nitrogen, and hydrogen.

10. The susceptor heater of claim 1 further comprising at least one fluid line exit positioned radially outside of the fluid line inlet.

11. The susceptor heater of claim 10 wherein each of the at least one fluid line exits surrounds a wafer lift pin.

12. The susceptor heater of claim 1 wherein each of the at least one fluid line exits is in fluid communication with a slot in the heating member.

13. The susceptor heater of claim 12 wherein the slot is in fluid communication with an outlet port.

14. The susceptor heater of claim 1 wherein the heat conductive fluid flows radially outward from the fluid line inlet.

15. The susceptor heater of claim 1 further comprising a heating element disposed within the heating member radially inward from the shim.

16. The susceptor heater of claim 15 wherein the heating element is positioned below a cavity formed by a susceptor, the shim, and the heating member.

17. A wafer processing apparatus comprising:
a susceptor having a top side and a backside;
a susceptor heater having a spacing member and a heating member;
a shim removably mounted between the susceptor and the susceptor heater;
a cavity formed by the susceptor backside, the susceptor heater, and the shim;
a fluid inlet communicating with the cavity; and,
a plurality of fluid outlets communicating with the cavity.

18. The wafer processing apparatus of claim 17 further comprising flowing a heat conducting fluid through the fluid inlet, the cavity, and the plurality of fluid outlets.

19. The wafer processing apparatus of claim 18 wherein the heat conducting fluid is helium.

20. The wafer processing apparatus of claim 18 wherein a heating element is disposed within the susceptor heater and provides thermal energy to the heat conducting fluid.

21. The wafer processing apparatus of claim 17 wherein a fluid flows radially outward from the fluid inlet to the plurality of fluid outlets through the cavity.

22. A method of heating a susceptor in a wafer processing chamber comprising the method of:
providing a susceptor having a top side and a backside, a susceptor heater having a spacing member and a heating member, a shim removably mounted between the susceptor and the susceptor heater, a cavity formed by the susceptor backside, the susceptor heater, and the shim, a fluid inlet communicating with the cavity, and a plurality of fluid outlets communicating with the cavity;
powering the heating element; and,
flowing a heat conductive fluid through the fluid inlet, the cavity, and the plurality of fluid outlets.

23. The method of claim 22 wherein the heat conductive fluid is helium.

24. The method of claim 22 wherein the fluid inlet orients the fluid flow within the cavity.

25. The method of claim 22 wherein a portion of the plurality of fluid outlets are adjacent the shim and a portion of the plurality of fluid outlets surround a plurality of lift pins.

26. The method of claim 22 wherein the heat conductive fluid is cooled prior to the flowing step to reduce the susceptor temperature.

* * * * *